United States Patent Office 3,732,097

Patented May 8, 1973

3,732,097

METHOD FOR DIRECTLY DEVELOPING A RELIEF IMAGE IN A POLYMERIZABLE COMPOSITION

John P. Dickie, Monroeville, Philip H. Harju, Spring Church, and David Kostishack, Verona, Pa., assignors to Koppers Company, Inc.

No Drawing. Filed Feb. 2, 1971, Ser. No. 112,082
Int. Cl. G03c *1/70, 5/00*
U.S. Cl. 96—35.1 4 Claims

ABSTRACT OF THE DISCLOSURE

A process for directly developing a relief image in a polymerizable composition is disclosed. The process involves an image-wise exposure of a polymerizable layer to a beam of actinic light, and differentially polymerizing the layer under the influence of this imagewise exposure to form directly a polymerized casting in the form of a relief image. Also, mirror-relief images can be developed directly on opposite surfaces of the resultant polymerized casting. The castings can be used for printing plates, circuit boards, and can be used to make fluidic amplifiers.

BACKGROUND OF THE INVENTION

It is well known that cerain polymerizable compositions, when exposed to light undergo polymerization to form hard polymers. Light-sensitive compositions of this type have been utilized on a wide scale in photography and photolithography for the production of polymeric, photographic images. According to conventional techniques, a light-sensitive layer containing at least one polymerizable compound is exposed to actinic light through an optical image to effect polymerization in the irradiated areas. Photopolymerization in this manner creates what is known in the art as a latent image. The image is developed by a suitable process, for example, by eluting the layer with a solvent that preferentially dissolves the unexposed, unpolymerized areas, and does not affect the exposed, photopolymerized areas thereby, providing the desired polymeric relief image.

Despite the wide spread commercial acceptance of latent image processes, certain disadvantages are nevertheless associated with it. A serious disadvantage is the necessity of using expensive solvents to remove the unpolymerized areas. Solvent removal of unpolymerized areas can prove economically prohibitive both from the standpoint of time-consumption as well as materials-handling. Moreover, the solvents frequently employed are organic materials, which are dangerous to handle being for the most part toxic and inflammable, etc. Further, because organic solvents are expensive, it becomes imperative, as a matter of economics, to use special techniques for solvent recovery, purification, etc. It is apparent that the many problems associated with the use of costly organic solvents tend to pose a series deterent to the exploitation of latent image-photopolymerization processes.

In accordance with this invention, it has been ascertained that the development of polymeric relief-images based upon conventional photopolymerizable compositions, can be achieved by a process which does not require a development of a latent, relief image.

SUMMARY OF THE INVENTION

The attainment of the foregoing is made possible in accordance with the present invention which provides a process for developing directly a relief image in the surface of a polymerizable composition. The surface of the polymerizable composition is exposed in an image-wise manner to actinic light, so as to create dark and light, portions on the surface of the polymerizable composition, in the form of a visual image. Exposure in this manner induces the differential polymerization throughout the light and dark portions to form a polymerized composition in the form of a relief image. In a special embodiment, the process can be used for developing directly mirror relief images on opposed surfaces of the resultant polymerized casting. To develop the mirror relief images the unexposed surface is contacted with a light absorbing layer before the exposed surface is exposed to the actinic light.

DETAILED DESCRIPTION

In carrying out the process of the invention the polymerizable composition is prepared for an image-wise exposure to actinic light as follows: The polymerizable composition is preferably contained in a mold. The mold must have at least one wall transparent to actinic light. Such a mold would be, for example, a standard glass plate mold which is composed of 2 spaced apart glass plates sealed together at their edges with a gasket. The mold is held together by spring clamps suitably positioned around the edges of the mold. Optionally, spacers can be inserted between the plates of glass to insure that they will maintain their spaced apart relationship. The liquid polymerizable composition is then charged to the mold through an opening in the gasket portion, filling the volume in between the glass plates. The filled mold is then ready for an image-wise exposure to actinic light. When the filled mold is disposed vertically for exposure of a sidewardly facing surface, the liquid polymerizable composition generally must be confined within the mold as described above. However, if the liquid polymerizable composition is disposed horizontally for exposure, it does not have to be so confined. Rather, the liquid polymerizable composition can be horizontally disposed in a shallow receptacle. The source of actinic light is then positioned above the receptacle such that it will shine down on the upwardly facing surface of the polymerizable liquid.

After the polymerizable composition has been prepared for photopolymerization, it is positioned, as described above, before a suitable source of actinic light for an image-wise exposure. Image-wise exposing the polymerizable composition to actinic light, means the rays of actinic light shining on the polymerizable composition are attenuated in such a manner as to create relatively light and dark portions on the surface of the polymerizable composition, thereby creating a visual image. The actinic light can be attenuated to create the visual image, for example by interposing a transparency bearing an image between the polymerizable composition and the source of the actinic light. The transparency bearing an image is sometimes called a master image, a stencil, or a negative image, has areas which are essentially transparent to actinic light (negative areas), and areas which are opaque to actinic light (positive areas). The transparency bearing an image can be placed in contact with the exposed surface of the polymerizable composition, or it may be spaced a distance from the polymerizable surface such that the image is projected onto the surface of the polymerizable composition. For greatest fidelity exposures are best made with the transparency in contact with, or spaced no more than a few mills from the photopolymerizable composition surface. However, if the enlargement of the original image is desired, the transparency should be some distance from the surface of the polymerizable composition and the image projected onto the surface of the polymerizable composition.

Once the polymerizable composition has been exposed imagewise to actinic light, the dark and light portions begin to differentially polymerize and continue to do so until a polymerizable system is obtained in the form of a relief image. Differentially polymerizing the light and dark portions means the exposed or light portions photopolymerize while maintaining their original volume, i.e. the exposed or light areas photopolymerized with essentially little volume contraction or shrinkage. The dark or unexposed areas on the other hand polymerize differentially undergoing volume contraction. This differential polymerization produces directly a polymerized casting in the form of a relief-image. It should be mentioned that the polymerization is not a surface phenomenon but is a polymerization which occurs throughout the composition.

The mechanism by which the process of the present invention functions has not been definitely ascertained, and is not self-evident. Nevertheless, and without intending to be bound by any theory, it is believed, that the exposed or light areas essentially photopolymerize, while the unexposed or dark areas polymerize differently or at a different rate. It is known that the dark areas, although polymerizing to form a hard surface which is recessed in the polymerizable composition, polymerize at a slower rate than the light-struck areas. Two reasons may account for the slower polymerization in the dark areas. First, the dark areas are not completely devoid of light, because of the nature of the optical system and scattering of light. The source of actinic light has diversion beams which probably scatter to small extent into the dark areas. The slower polymerization may reflect only the degree of, rather than an absence of photopolymerization. Second, the dark areas may be slowly polymerizing by other means for example, thermal polymerization. This thermal polymerization would probably also be occurring in the light areas, but its effect would be negated by the faster photopolymerization. It is of course possible that various combinations of the above proposed mechanisms may be occurring simultaneously serving to create a differential polymerization in the light and dark areas.

The reason the different rates and/or types of polymerization result in the development of a relief image may be due to a transfer of matter from the dark to the light areas. Shrinkage of a polyester resin is a general phenomena as polymerization occurs. When polymerization occurs in the light portions it might be expected that this portion would shrink and cause a depression. However, just the opposite occurs and the depressions appear in the dark portions and the light portions remain closer to the original thickness of the casting. The results can be rationalized by postulating a transfer of matter from the dark portions to the light portions during the polymerization. The different rates and/or types of polymerization may create concentration gradients between the light and dark portions. The osmotic pressure caused by the concentration gradients may be driving force for drawing unpolymerized material or partially polymerized material from the dark portions into the light portions. Osmotic forces can be large and are well known in "popcorn polymers" where polymer absorbs monomer.

In any event it appears that different rates of polymerization and possibly the different types of polymerization are occurring in the light and dark portions to produce in the polymerizable composition a physical and possibly a chemical differential between the light and the dark portions and it is this differential which results in the direct development of a relief image.

After the polymerizable composition has differentially polymerized to a solid condition in the form of a relief image, the casting may optionally be post-cured at a temperature of about 75 to 150° C. for about 30 to 120 minutes to further harden the composition. Also, if it is found that the dark portions have not sufficiently hardened, the entire casting may be eluted with a suitable solvent to deepen the image. The elution preferentially dissolves unpolymerized material and polymeric species in the dark portions which have not hardened.

The polymerizable compositions of the invention can broadly be classified as unsaturated, addition, polymerizable compositions. Preferred polymerizable compositions are those which have ethylenic unsaturation and which are capable of a cross-linking polymerization. Particularly useful polymerizable compositions are polymer-monomer mixtures in which polymer portions contain a plurality of ethylenically unsaturated, addition, polymerizable linkages which are capable of cross-linking with the monomer portion. A useful class of such polymer-monomer mixtures are the unsaturated polyester condensates which are dissolved in a vinyl aromatic monomer. The unsaturated polyesters are produced by polycondensing approximately equal molar amounts of dicarboxylic acids at least a portion of which contains ethylenic unsaturation and a dihydric alcohol. The term "unsaturated polyester" as used herein is intended to define the condensation polymer while the term "unsaturated polyester resin" as used herein is intended to define the mixture of:

(1) an unsaturated polyester condensation polymer; and
(2) a vinyl-aromatic monomer which can be eventually copolymerized with a condensation polymer.

As mentioned above, at least a portion of the dicarboxylic acids used in the polyesterification must contain ethylenic unsaturation. Examples of such unsaturated dicarboxylic acids include maleic, fumaric, citraconic, mesaconic, itaconic and the like. However, it is preferred that at least a portion of the ethylenically unsaturated moieties be either maleic and/or fumaric moieties. Suitable also are dicarboxylic acid anhydrides of the above dicarboxylic acids. The remainder of the dicarboxylic acids are usually either saturated normal aliphatic dicarboxylic acids such as adipic acid, succinic acid, suberic acid, glutaric acid, pimellitic acid or the like, or aromatic dicarboxylic acids such as phthalic acid, isophthalic acid, terephthalic acid, or carboxylic acids such as tetrahydrophthalic acids.

Examples of the dihydric alcohols used in the polyesterification are ethylene glycol, 1,2-propane diol, or if a more flexible polyester is desired, the ether glycols such as diethylene glycol, dipropylene glycol and the like. Cyclic glycols such as 1,4-cyclohexanedimethanol or the adducts or reaction products of alkylene oxides with bisphenol A are also well known constituents of polyesterification products which may be used as diols in the unsaturated polyester resins.

The processes for preparing such unsaturated polyesters are well known in the art and can be reviewed, for example, in U.S. Pat. 2,255,313.

After formation, the unsaturated polyester is dissolved in an ethylenically unsaturated monomer. Suitable monomers are the vinylidine monomers, particularly the vinyl monomers. Such monomers would be for example, the vinyl aromatic monomers or more particularly the vinylstyrene type monomers. Illustrative of the copolymerizable, ethylenically, unsaturated, cross-linking monomers are styrene, alpha-methyl styrene, chlorostyrene, vinyl toluene, divinylbenzene and the like. The amount of monomer used usually ranges from about 20 to 70% by weight based on the total weight of the polyester and monomer portion.

Most commercially available polymerizable compositions which are useful in the practice of this invention normally contain minor amounts of polymerization inhibitors to increase the shelf-life of polymerizable compositions by preventing spontaneous polymerization before desired. The presence of these inhibitors, which are usually of the anti-oxidant type, for example hydroquinone, t-butyl catechol and the like, in amounts which are known to inhibit spontaneous polymerization, also inhibit photopolymerization. The obvious result is that if the portions of the polymerizable composition of the invention exposed to actinic light do not photopolymerize, the relief image will not develop. Therefore, in order to use commercially available polymerizable compositions which have these polymerization inhibitors, the inhibitors must either be removed from the composition before using or alternately a polymerization promotor must be incorporated into the inhibited polymerizable composition. The promotor overcomes the adverse effects of the inhibitor to photopolymerization. Suitable promoters are aliphatic polyamines as illustrated by the following general formula:

$$H(HNCR_2CR_2)_nNH_2,$$

wherein R is hydrogen or lower alkyl radical containing less than 5 carbon atoms and $n$ is an integer of 2 to 4. Examples of suitable aliphatic polyamines are diethylenetriamine, triethylenetetramine, tetraethylene pentamine, and the like.

Also suitable as promotors are polyamide resins, which are condensation products of aliphatic polyamines and unsaturated polymeric fatty acids. Particularly suitable polyamide resins are those sold commercially under the trademark Versamid. These polyamide resins are disclosed in U.S. Pats. 2,379,413, 2,839,549 and 3,002,941.

The concentrations of the aliphatic polyamine or polyamide resins which should be incorporated into an inhibited polymerizable composition is from .1 to 7% by weight based on the total weight of the polymerizable composition. Using less than .1% leaves inhibited polymerizable composition which is difficult to photopolymerize. Using greater than 7% by weight results in a polymerizable composition which is too unstable to be useful in the practice of this invention. The resultant polymerizable composition will prematurely gel.

In order to effectively differentially polymerize the polymerizable compositions a free-radical generating catalyst should be present in the polymerizable composition. Suitable examples of the free-radical generating catalyst are the peroxide type catalyst. Specific examples include benzoyl peroxide and t-butyl peroctoate. The free-radical generating catalyst should also be present if a post-hardening step is used.

Actinic light from any source and of any type can be used in carrying out the process of this invention. The light may emanate from a point source or from a broad light source and can be in the form of parallel rays or divergent beams. In order to reduce the exposure time, it is preferred to use a light source of high intensity. Many of the available light sources emit radiation in both the ultraviolet and the visible region of the spectrum, but it is the emission of the latter region which is of particular interest in this invention. Therefore actinic light having a wave length of from 2500 to 7000 angstrom units preferably within the range of 3500 to 5000 angstrom units is suitable in the practice of this invention for directly developing a relief image. Suitable sources include incandescent lamps, fluorescent lamps, particularly those with visible light emitting phosphors, tungsten lamps, carbon arcs, mercury vapor arcs, argon glow lamps, electronic flash units, photographic flood lamps and direct sunlight.

The selection of the correct exposure time is an important feature in the differential polymerization process of this invention. Thus, in making relief images it is essential that the exposure time be sufficient to cause a differential polymerization and to develop directly a relief image. An exposure time of at least 30 minutes should be used.

The time of exposure will depend on the identity of the polymerizable composition employed in the direct development process of this invention. Also, the time of exposure will be dependent on the intensity of the light source, on whether there are inhibitors, promotors and free-radical generating catalysts present in the polymerizable composition. Also, the ambient temperatures and the thickness of the polymerizable composition will affect the exposure required. In general, the thicker the layer to be polymerized the longer is the exposure required. Inasmuch as the polymerization usually increases at higher temperatures than room temperature less exposure is required at higher temperatures than at room temperature. In view of all these factors which influence the exposure, it has been found that the exposure time is best determined by trial and error much as any photographic material must be handled.

The thickness of the resultant polymerized casting can be varied over a relatively wide range, that is, from 0.008 to 0.5 inch with sharp image resolution.

The depth of the relief image formed by the process of the invention is about 0.1 to 50 mils depending of course on the thickness of the casting, and is dependent on a number of interdependent variables, such as time of exposure, intensity of the light source, chemical identity of the polymerizable composition, inhibitors and promotors which may be incorporated into the polymerizable composition, and most importantly the character of the original image to be reproduced.

Somewhat surprisingly, the relief image produced by the process of the invention can be developed as mirror relief images on opposite surfaces of the polymerizable composition. To develop mirror relief images the polymerizable composition is contacted with a light absorbing layer, so as to form an interfacial surface between the polymerizable composition and the light absorbing layer. The opposite surface is then exposed image-wise to actinic light to develop directly mirror relief images on both the exposed and interfacial surfaces of the polymerizable composition. The light absorbing layer can be for example one wall of the mold described above, and can be made of black glass or can be a polymer material which is pigmented with a light absorbing pigment such as carbon black or magnanese dioxide, or can be black anodized aluminum.

The photopolymerization process described herein may be employed in numerous modifications and ramifications. Such a system is applicable to image-wise polymerization as exemplified in the production of circuit boards, and integral printing plates for use in the graphic arts. Another application of the process of the invention relates to its use for the production of fluidic amplifiers or other hollow core systems. An effect found in the relief images directly developed according to the present invention, is that the mirror images can be formed on opposite sides of the polymerized casting. If the castings are cut in a horizontal plane mid-way between the image bearing surfaces and the two surfaces superimposed on one another, a casting with a hollow interior of any desired complexity could be formed. Thus, fluidic amplifiers could be made according to the process of the invention and would not have to be made by the present procedure which requires a rather precise boring into a solid casting.

A still further application of the process of the invention relates to its use for the production of polymer portraits. The process of the invention not only differentially polymerizes intense dark and light portions but also differentially polymerizes dark and light portions of varying intensity. Thus, a relief image can be made with a cloudy transparent positive and the relief image would have the appearance of the photograph or portrait if viewed at the proper angle, the clarity of the relief-image depending on the cloudiness of the light areas in the positive.

EXAMPLE I

Two glass plates (6″ x 6″ x ¼″) were thoroughly cleaned and dried. One glass plate was clear, pyrex glass and the other plate was black glass. One side of each plate was sprayed with a mold release agent made by Price-Driscol. The two glass plates were positioned parallel to one another in a spaced apart relationship with the sprayed surfaces facing one another. A gasket was positioned between the two plates such that it sealed them on three edges. Teflon spacers were placed on the outside edge of the gasket to maintain a uniform opening between the two plates of glass, about ⅛ inch. The mold was held together with binder clips positioned along the three sealed edges. The mold was then put into an oven at 150° C. for one hour to compress the gasket to the thickness of the spacers. The mold was then removed from the oven and cooled to room temperature.

80 grams of an unsaturated polyester resin was charged to the mold through the unsealed edge. The polyester resin was made by condensing 1.0 mole of maleic anhydride with 1.1 moles of propylene glycol at 150–196° C. for 12 hours, to form a polyester condensate having an acid number of 25. The polyester condensate was then diluted with an equal amount by weight of styrene monomer, and 1.3% by weight based on weight of the polyester resin of benzoyl peroxide was added to the resin.

An image, being a 35 millimeter photopositive slide of an electrical circuit, was projected onto the surface of the polymerizable composition, by using a 35 millimeter slide projector. The light source in the projector was a 750 watt tungsten lamp and was located 24 inches from the surface of the polymerizable composition. Exposure was for 12 hours.

This treatment caused substantial polymerization to take place. The mold was then taken apart and the contents examined. The composition had polymerized to a stiff, gelled sheet with clear, mirror relief images developed on both surfaces of the casting.

The casting was then placed in a vented oven at 75° C. for 2 hours to harden further the casting. The casting had a thickness of about ⅛ inch and the dark recessed portions of the casting had a depth of about 5 mils.

EXAMPLE II

An experiment similar to Example I was undertaken with the exception that a 150 watt lit incandescent lamp was used as the light source and was positioned 10 inches from the exposed face of the mold. A photonegative image of an electrical circuit was taped to the outside of the clear glass face of the mold. Upon exposure to light under these conditions for 16 hours substantial polymerization took place. The mold was then taken apart and the contents examined. A polymerized composition in the form of a stiff, gelled sheet with sharp, mirror, relief images developed on both surfaces of the casting was obtained.

EXAMPLE III

An experiment similar to Example I was undertaken with the exception that a specially promoted, commercial-grade unsaturated polyester resin which contained a hydroquinone inhibitor was used in place of the polyester resin of Example I. The polyester resin was one sold commercially by Koppers Company, Inc., under the tradename Koppers Polyester Resin 1000. To this commercial resin, was added 1% by weight of a polyamide resin promoter. The polyamide resin was sold commercially under the trademark Versamid 140.

Upon exposure to light, in accordance with the procedure of Example I substantial polymerization took place resulting in the sharp, mirror, relief images being developed on both surfaces of the resultant casting.

When the experiment was repeated with tetraethylene pentamine, triethylene tetramine, each used separately as a substitute for the Versamid 140, sharp, mirror, relief images developed on both surfaces of the resultant polymerized casting.

EXAMPLE IV

An experiment similar to Example I was undertaken with the exception that clear glass was substituted for the black glass. Upon exposing a polymerizable composition to actinic light, as described in Example I, a sharp relief light image was developed only on the exposed surface of the resultant polymerized casting. The back surface of the casting was smooth.

What is claimed is:

1. A process for developing directly mirror relief images on opposed surfaces of a polymerizable composition comprising:

(a) contacting one surface of the polymerizable composition with a light absorbing layer so as to form an interfacial surface therebetween;

(b) exposing the other surface of the polymerizable composition which is opposed to the interfacial surface to actinic light through an image-forming means so as to produce dark and light areas on the exposed surface of the polymerizable composition, thereby creating an image on said surface and so differentially polymerizing said light and dark areas to form a polymerized composition in the form of mirror relief images which are developed on opposed surfaces of the polymerized composition.

2. A process for developing directly mirror relief images on opposed surfaces of a polymerizable composition comprising:

(1) contacting one surface of the polymerizable composition with a light absorbing layer so as to form an interfacial surface therebetween;

(2) exposing the other surface of the polymerizable composition which is opposed to the interfacial surface to actinic light through an image-forming means so as to produce dark and light areas on the exposed surface of the polymerizable composition, thereby creating an image on said surface and so differentially polymerizing said light and dark areas to form a polymerized composition in the form of mirror relief images which are developed on opposed surfaces of the polymerizable composition; wherein the polymerizable composition comprises:

(a) an alpha-beta ethylenically unsaturated polyester that is produced by polycondensing approximately equal molar amounts of dicarboxylic acids at least a portion of which contains ethylenic unsaturation and a dihydric alcohol;

(b) a vinyl monomer that is copolymerizable with said polyester; and (c) an aliphatic polyamine containing from four to eight carbon atoms or a polyamide that is the condensation product of an aliphatic amine and an unsaturated polymer fatty acid.

3. A process according to claim 2 wherein the composition contains therein a polymerization inhibitor to prevent spontaneous polymerization of said unsaturated polyester resin before use and contains sufficient amine or polyamine to overcome the effects of said polymerization inhibitor when said unsaturated polyester resin is subjected to polymerization conditions.

4. A process according to claim 3 wherein the composition has contained therein a free radical polymerization catalyst.

References Cited

UNITED STATES PATENTS

| | | | |
|---|---|---|---|
| 2,673,151 | 3/1954 | Gerhart | 96—35.1 |
| 3,002,941 | 10/1961 | Peterson | 260—18 |
| 3,549,366 | 12/1970 | Margerum | 96—35.1 |

OTHER REFERENCES

| | | | |
|---|---|---|---|
| 566,795 | 4/1943 | Great Britain | 96—35.1 |
| 741,294 | 11/1955 | Great Britain | 96—35.1 |

RONALD H. SMITH, Primary Examiner

U.S. Cl. X.R.

96—84 R, 115 R, 115 P; 204—159.15